US010481830B2

(12) United States Patent
Higgins et al.

(10) Patent No.: US 10,481,830 B2
(45) Date of Patent: Nov. 19, 2019

(54) SELECTIVELY THROTTLING HOST READS FOR READ DISTURBS IN NON-VOLATILE MEMORY SYSTEM

(71) Applicant: SanDisk Technologies LLC, Plano, TX (US)

(72) Inventors: James M. Higgins, Chandler, AZ (US); Ryan R. Jones, Mesa, AZ (US)

(73) Assignee: SanDisk Technologies LLC, Plano, TX (US)

( * ) Notice: Subject to any disclaimer, the term of this patent is extended or adjusted under 35 U.S.C. 154(b) by 85 days.

(21) Appl. No.: 15/422,421

(22) Filed: Feb. 1, 2017

(65) Prior Publication Data

US 2018/0024777 A1 Jan. 25, 2018

Related U.S. Application Data

(60) Provisional application No. 62/366,570, filed on Jul. 25, 2016.

(51) Int. Cl.
*G06F 3/06* (2006.01)
*G11C 16/26* (2006.01)
*G11C 16/34* (2006.01)

(52) U.S. Cl.
CPC .......... *G06F 3/0659* (2013.01); *G06F 3/0616* (2013.01); *G06F 3/0679* (2013.01);
(Continued)

(58) Field of Classification Search
CPC .... G06F 3/0659; G06F 3/0616; G06F 3/0679; G11C 16/349; G11C 16/3422; G11C 16/26
See application file for complete search history.

(56) References Cited

U.S. PATENT DOCUMENTS 4,586,167 A 4/1986 Fujishima et al.
5,559,988 A 9/1996 Durante et al.
(Continued)

FOREIGN PATENT DOCUMENTS

EP   0 376 285 A2   7/1990
WO   WO 2012/083308   6/2012

OTHER PUBLICATIONS

Atmel Data-sheet, "9-to-bit Selectable, ±0.5° C. Accurate Digital Temperature Sensor with Nonvolatile Registers and Serial EEPROM" www.atmel.com/images/Atmel-8854-DTS-AT30TSE752A-754A-758A-Datasheet.pdf, Atmel Data-sheet, Mar. 1, 2011,—Atmel-8854-DTS-AT30TSE752A-754A-758A-Datasheet_102014, 57 pages.
(Continued)

*Primary Examiner* — Larry T Mackall
(74) *Attorney, Agent, or Firm* — Brinks Gilson & Lione

(57) ABSTRACT

The various implementations described herein include systems, methods, and/or devices used to selectively throttle host reads in memory devices. The method includes: (1) identifying a storage location in the non-volatile memory system with high read disturbs vulnerable to reliability issues, (2) determining if the identified storage location is being throttled for host reads, (3) in accordance with a determination that the identified storage location does not satisfy the predefined read throttling criteria, initiate execution of a read operation, otherwise, enqueue read commands for deferred execution.

19 Claims, 4 Drawing Sheets

(52) U.S. Cl.
CPC ............ *G11C 16/26* (2013.01); *G11C 16/349* (2013.01); *G11C 16/3422* (2013.01)

(56) References Cited

U.S. PATENT DOCUMENTS

| | | |
|---|---|---|
| 5,603,001 A * | 2/1997 | Sukegawa ............ G06F 3/0601 711/103 |
| 5,909,559 A | 6/1999 | So |
| 6,247,136 B1 | 6/2001 | MacWilliams et al. |
| 6,292,410 B1 | 9/2001 | Yi et al. |
| 6,401,213 B1 | 6/2002 | Jeddeloh |
| 6,449,709 B1 | 9/2002 | Gates |
| 7,969,809 B2 | 6/2011 | Ben-Rubi |
| 8,010,738 B1 | 8/2011 | Chilton et al. |
| 8,122,202 B2 | 2/2012 | Gillingham |
| 8,213,255 B2 | 7/2012 | Hemink et al. |
| 8,255,618 B1 | 8/2012 | Borchers et al. |
| 8,321,627 B1 | 11/2012 | Norrie et al. |
| 8,429,498 B1 | 4/2013 | Anholt et al. |
| 8,479,080 B1 | 7/2013 | Shalvi et al. |
| 8,539,139 B1 | 9/2013 | Morris |
| 8,595,590 B1 | 11/2013 | Vojcic et al. |
| 8,775,720 B1 | 7/2014 | Meyer et al. |
| 8,825,967 B2 | 9/2014 | Hong Beom |
| 8,874,836 B1 | 10/2014 | Hayes et al. |
| 8,886,872 B1 | 11/2014 | Norrie |
| 8,924,661 B1 | 12/2014 | Shachar et al. |
| 8,984,376 B1 | 3/2015 | Norrie |
| 9,128,825 B1 | 9/2015 | Albrecht et al. |
| 9,170,876 B1 | 10/2015 | Bates et al. |
| 9,176,971 B2 | 11/2015 | Shapiro |
| 9,214,965 B2 | 12/2015 | Fitzpatrick et al. |
| 2003/0115403 A1 | 6/2003 | Bouchard et al. |
| 2003/0122834 A1 | 7/2003 | Mastronarde et al. |
| 2004/0117441 A1 | 6/2004 | Liu et al. |
| 2005/0144361 A1 | 6/2005 | Gonzalez et al. |
| 2005/0248992 A1 | 11/2005 | Hwang et al. |
| 2007/0002629 A1 | 1/2007 | Lee et al. |
| 2007/0033376 A1 * | 2/2007 | Sinclair ................ G06F 3/0605 711/203 |
| 2007/0156998 A1 | 7/2007 | Gorobets |
| 2007/0233937 A1 | 10/2007 | Coulson et al. |
| 2008/0140914 A1 | 6/2008 | Jeon |
| 2008/0147994 A1 | 6/2008 | Jeong et al. |
| 2008/0228992 A1 * | 9/2008 | Dumitru ............... G06F 3/0613 711/100 |
| 2008/0235466 A1 | 9/2008 | Traister |
| 2008/0235480 A1 | 9/2008 | Traister |
| 2008/0295094 A1 | 11/2008 | Korupolu et al. |
| 2009/0168525 A1 | 7/2009 | Olbrich et al. |
| 2009/0177943 A1 | 7/2009 | Silvus et al. |
| 2009/0193174 A1 * | 7/2009 | Reid .................... G06F 12/0246 711/100 |
| 2009/0222627 A1 | 9/2009 | Reid |
| 2009/0282191 A1 | 11/2009 | Depta |
| 2010/0005217 A1 | 1/2010 | Jeddeloh |
| 2010/0014364 A1 | 1/2010 | Laberge et al. |
| 2010/0082879 A1 | 4/2010 | McKean et al. |
| 2010/0165730 A1 | 7/2010 | Sommer et al. |
| 2010/0174845 A1 | 7/2010 | Gorobets et al. |
| 2010/0174853 A1 | 7/2010 | Lee et al. |
| 2010/0220509 A1 | 9/2010 | Solokov et al. |
| 2010/0250874 A1 | 9/2010 | Farrell et al. |
| 2011/0113204 A1 | 5/2011 | Henriksson et al. |
| 2011/0138100 A1 | 6/2011 | Sinclair |
| 2011/0235434 A1 | 9/2011 | Byom et al. |
| 2011/0252215 A1 | 10/2011 | Franceschini et al. |
| 2011/0264851 A1 | 10/2011 | Jeon et al. |
| 2011/0302474 A1 | 12/2011 | Goss et al. |
| 2012/0030408 A1 | 2/2012 | Flynn et al. |
| 2012/0047317 A1 | 2/2012 | Yoon et al. |
| 2012/0159070 A1 | 6/2012 | Baderdinni et al. |
| 2012/0198129 A1 | 8/2012 | Van Aken et al. |
| 2012/0224425 A1 | 9/2012 | Fai et al. |
| 2012/0278530 A1 | 11/2012 | Ebsen |
| 2012/0324180 A1 | 12/2012 | Asnaashari et al. |
| 2013/0007380 A1 | 1/2013 | Seekins et al. |
| 2013/0070507 A1 | 3/2013 | Yoon |
| 2013/0111112 A1 | 5/2013 | Jeong et al. |
| 2013/0111289 A1 | 5/2013 | Zhang et al. |
| 2013/0111290 A1 | 5/2013 | Zhang et al. |
| 2013/0132650 A1 | 5/2013 | Choi et al. |
| 2013/0182506 A1 | 7/2013 | Melik-Martirosian |
| 2013/0219106 A1 | 8/2013 | Vogan et al. |
| 2013/0232290 A1 | 9/2013 | Ish et al. |
| 2013/0254498 A1 | 9/2013 | Adachi et al. |
| 2013/0262745 A1 | 10/2013 | Lin et al. |
| 2013/0297894 A1 | 11/2013 | Cohen et al. |
| 2013/0346805 A1 | 12/2013 | Sprouse et al. |
| 2014/0006688 A1 | 1/2014 | Yu et al. |
| 2014/0013026 A1 | 1/2014 | Venkata et al. |
| 2014/0047170 A1 | 2/2014 | Cohen et al. |
| 2014/0075100 A1 | 3/2014 | Kaneko et al. |
| 2014/0143637 A1 | 5/2014 | Cohen et al. |
| 2014/0173239 A1 | 6/2014 | Schushan |
| 2014/0229655 A1 | 8/2014 | Goss et al. |
| 2014/0229656 A1 | 8/2014 | Goss et al. |
| 2014/0241071 A1 | 8/2014 | Goss et al. |
| 2014/0244897 A1 | 8/2014 | Goss et al. |
| 2014/0244899 A1 | 8/2014 | Schmier et al. |
| 2014/0258598 A1 | 9/2014 | Canepa et al. |
| 2014/0281833 A1 | 9/2014 | Kroeger et al. |
| 2014/0310241 A1 | 10/2014 | Goyen |
| 2014/0379988 A1 | 12/2014 | Lyakhovitskiy et al. |
| 2015/0067172 A1 | 3/2015 | Ashokan et al. |
| 2015/0074487 A1 | 3/2015 | Patapoutian et al. |
| 2015/0095558 A1 | 4/2015 | Kim et al. |
| 2015/0113206 A1 | 4/2015 | Fitzpatrick et al. |
| 2015/0186278 A1 | 7/2015 | Jayakumar et al. |
| 2015/0234612 A1 | 8/2015 | Himelstein et al. |
| 2015/0261473 A1 | 9/2015 | Matsuyama et al. |
| 2015/0262632 A1 | 9/2015 | Shelton et al. |
| 2015/0301749 A1 | 10/2015 | Seo et al. |
| 2015/0331627 A1 | 11/2015 | Kwak |
| 2016/0026386 A1 | 1/2016 | Ellis et al. |
| 2016/0034194 A1 | 2/2016 | Brokhman et al. |
| 2016/0062699 A1 | 3/2016 | Samuels et al. |
| 2016/0070493 A1 | 3/2016 | Oh et al. |
| 2016/0071612 A1 | 3/2016 | Takizawa et al. |
| 2016/0117099 A1 | 4/2016 | Prins et al. |
| 2016/0117102 A1 | 4/2016 | Hong et al. |
| 2016/0117105 A1 | 4/2016 | Thangaraj et al. |
| 2016/0117252 A1 | 4/2016 | Thangaraj et al. |
| 2016/0170671 A1 | 6/2016 | Huang |
| 2016/0170831 A1 | 6/2016 | Lesatre et al. |
| 2016/0179403 A1 | 6/2016 | Kurotsuchi et al. |
| 2016/0210060 A1 | 7/2016 | Dreyer |
| 2016/0299689 A1 | 10/2016 | Kim et al. |
| 2016/0299699 A1 | 10/2016 | Vanaraj et al. |
| 2016/0299704 A1 | 10/2016 | Vanaraj et al. |
| 2016/0299724 A1 | 10/2016 | Vanaraj et al. |
| 2016/0342344 A1 | 11/2016 | Kankani et al. |
| 2016/0342345 A1 | 11/2016 | Kankani et al. |
| 2016/0371394 A1 | 12/2016 | Shahidi et al. |

OTHER PUBLICATIONS

Seagate Technology, "SCSI Commands Reference Manual, Rev. C", Product Manual dated Apr. 2010, pp. 211-214.

Tanenbaum, "Structured Computer Organization", 3rd edition 1990, section 1.4, p. 11, 3 pages.

International Search Report and Written Opinion dated Nov. 18, 2015, received in International Patent Application No. PCT/US2015/039552 which corresponds to U.S. Appl. No. 14/559,183, 11 pages (Ellis).

International Search Report and Written Opinion dated Jul. 4, 2016, received in International Patent Application No. PCT/US2016/028477, which corresponds to U.S. Appl. No. 14/883,540, 11 pages (Hodgdon).

International Search Report and Written Opinion dated Nov. 9, 2015, received in International Patent Application No. PCT/US2015/053551, which corresponds to U.S. Appl. No. 14/668,690, 12 pages (Thangaraj).

(56) References Cited

OTHER PUBLICATIONS

International Search Report and Written Opinion dated Nov. 11, 2015, received in International Patent Application No. PCT/US2015/053582, which corresponds to U.S. Appl. No. 14/659,493, 12 pages (Prins).

International Search Report and Written Opinion dated Sep. 8, 2016, received in International Patent Application No. PCT/US2016/036716, which corresponds to U.S. Appl. No. 14/925,945, 13 pages (Ellis).

* cited by examiner

SELECTIVELY THROTTLING HOST READS FOR READ DISTURBS IN NON-VOLATILE MEMORY SYSTEM

RELATED APPLICATIONS

This application claims priority to U.S. Provisional Patent Application No. 62/366,570, filed Jul. 25, 2016, which is hereby incorporated by reference in its entirety.

TECHNICAL FIELD

The disclosed embodiments relate generally to non-volatile memory systems, and in particular, to selectively throttling read commands or operations in a non-volatile memory system (e.g., comprising one or more flash memory devices).

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Flash memory is a non-volatile data storage device that can be electrically erased and reprogrammed. More generally, non-volatile memory (e.g., flash memory, as well as other types of non-volatile memory implemented using any of a variety of technologies) retains stored information even when not powered, as opposed to volatile memory, which requires power to maintain the stored information.

While non-volatile memory retains data even when not powered, in some non-volatile memory systems, the data in each memory portion (e.g., a memory block) cannot be reliably read more than a predefined number of times, sometimes called a read disturb threshold, because the read operations "disturb" the stored data (e.g., change the amount of charge stored of floating gates of the transistors on which the data is stored). Thus, a problem arises when the number of read operations on a memory portion exceeds the read disturb threshold.

SUMMARY

Various embodiments of systems, methods and devices within the scope of the appended claims each have several aspects, no single one of which is solely responsible for the attributes described herein. Without limiting the scope of the appended claims, after considering this disclosure, and particularly after considering the section entitled "Detailed Description," one will understand how the aspects of various embodiments are used to enable adaptive verify voltage adjustment in memory devices.

The disclosed device and method improves the endurance of non-volatile memory, such as flash memory, by identifying areas of the media that store data vulnerable to read disturbs and introduce a mechanism to throttle corresponding host reads. With a determination that host reads of data stored in the storage location are throttled, and in accordance with the storage location satisfying non-activity criteria, a host read, or a corresponding read command, is enqueued for deferred execution.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate the more pertinent features of the present disclosure and are therefore not to be considered limiting, for the description may admit to other effective features.

Figure 1:
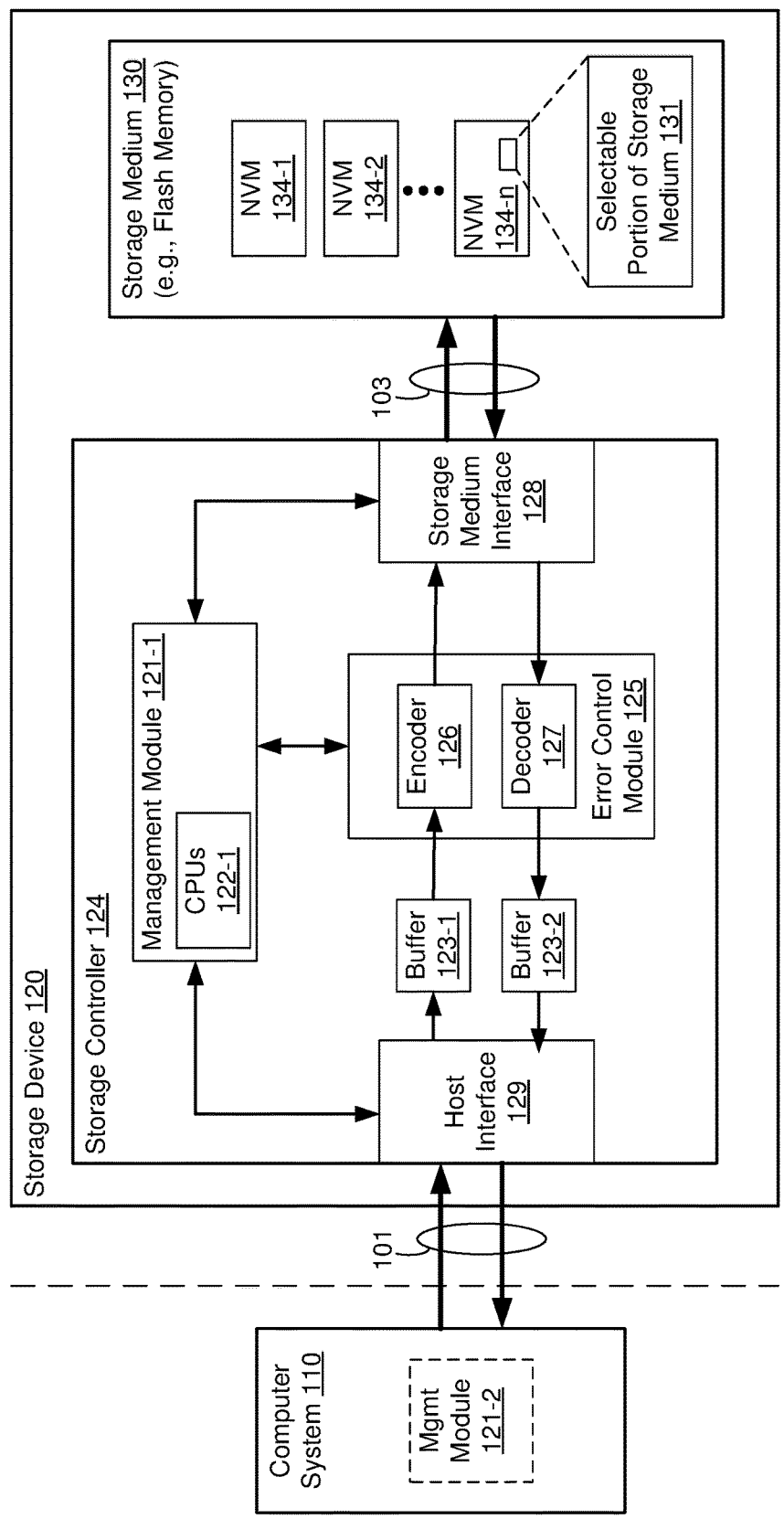
FIG. 1 is a block diagram illustrating an implementation of a non-volatile memory system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices used to process read requests in memory devices. Some implementations include systems, methods, and/or devices to throttle the read requests received from external host devices.

(A1) More specifically, some embodiments include a method of processing read requests in a non-volatile memory system. The method includes: (1) receiving, from a host device external to the non-volatile memory system, a read request to read data from the non-volatile memory system in response to receiving the read request, (2) identifying a storage location in the non-volatile memory system corresponding to data requested by the read request received from the host device, (3) determining if the identified storage location satisfies predefined read throttling criteria, (4) in accordance with a determination that the identified storage location does not satisfy the predefined read throttling criteria, initiating execution of a read operation on the identified storage location, and (5) in accordance with a determination that the identified storage location satisfies the predefined read throttling criteria, enqueuing a read command to perform a read operation on the identified storage location for deferred execution.

(A2) In some embodiments of the method of A1, determining if the identified storage location satisfies predefined read throttling criteria includes determining if the identified storage location satisfies predefined read disturb criteria.

(A3) In some embodiments of the method of A2, determining if the identified storage location satisfies predefined read disturb criteria includes determining if the identified storage location falls within a range of non-volatile memory locations that satisfy the predefined read disturb criteria.

(A4) In some embodiments of the method of A3, the range of non-volatile memory locations satisfy the predefined read disturb criteria if a read disturb count for the range of non-volatile memory locations satisfies a read disturb count threshold.

(A5) In some embodiments of the method of A3 or A4, determining if the identified storage location satisfies predefined read throttling criteria includes (1) determining if the identified storage location satisfies predefined read disturb criteria, and (2) further determining whether execution of at least one read operation on a location within the identified range of non-volatile memory locations has been initiated during a predetermined time period.

(A6) In some embodiments of the method of A3, determining if the identified storage location satisfies predefined read throttling criteria includes (1) determining if the identified storage location satisfies predefined read disturb criteria, and (2) further determining if said range of non-volatile memory locations satisfy predefined non-activity criteria.

(A7) In some embodiments, the method of any of A1-A6, wherein enqueuing the read command on the identified storage location for deferred execution includes placing said read command on a command execution queue that corresponds to said range of non-volatile memory locations.

(A8) In some embodiments of the method of any of A1-A7, further includes initiating execution of read operations corresponding to read commands enqueued on one or more command execution queues at predefined times.

(A9) In some embodiments, the method of A8 further includes, for each predefined range of memory locations for which at least one read command has been enqueued, initiating execution of read operations corresponding to respective enqueued read commands, for reading data in the predefined range of memory locations, at a predefined rate, or at predefined scheduled times, until there are no read commands enqueued for said predefined range of memory locations.

(A10) In some embodiments of the method of any of A1-A9, identifying a storage location in the non-volatile memory system corresponding to data requested by the read request received from the host device includes translating a logical address specified by the read request into a physical address in non-volatile memory in the non-volatile memory system, wherein the logical address is in a logical address space of the host device and the physical address is a physical address in a physical address space of the non-volatile memory system.

(A11) In another aspect, a non-volatile memory controller for controlling access to non-volatile memory in a non-volatile memory system, includes non-volatile memory; a host interface for receiving, from a host device external to the non-volatile memory system, a read request to read data from the non-volatile memory system; one or more processors; and memory storing one or more programs for execution by the one or more processors, the one or more programs including instructions for: (1) identifying a storage location in the non-volatile memory system corresponding to data requested by the read request received from the host device, (2) determining if the identified storage location satisfies predefined read throttling criteria, (3) in accordance with a determination that the identified storage location does not satisfy the predefined read throttling criteria, initiating execution of a read operation on the identified storage location, and (4) in accordance with a determination that the identified storage location satisfies the predefined read throttling criteria, enqueuing a read command to perform a read operation on the identified storage location for deferred execution.

(A12) In some embodiments of the non-volatile memory controller of A11, the one or more programs include a read module for receiving read requests from the host device and for initiating executions of read operations on particular storage locations in the non-volatile memory system, a read disturb module for counting or tracking read disturbs on predefined memory portions on non-volatile memory system, and a deferred execution module for initiating execution of read commands that have been enqueued for deferred execution.

(A13) In some embodiments of the non-volatile memory controller of any of A11 and A12, the one or more programs include instructions that when executed by the one or more processors cause the non-volatile memory system to perform the method of any of A2-A10, described above.

(A14) In yet another aspect, a non-transitory computer readable storage medium stores one or more programs configured for execution by a non-volatile memory controller in a non-volatile memory system, the one or more programs comprising instructions to process a read request, received from a host system external to the non-volatile memory system by (1) identifying a storage location in the non-volatile memory system corresponding to data requested by the read request received from the host device, (2) determining if the identified storage location satisfies predefined read throttling criteria, (3) in accordance with a determination that the identified storage location does not satisfy the predefined read throttling criteria, initiating execution of a read operation on the identified storage location, and (4) in accordance with a determination that the identified storage location satisfies the predefined read throttling criteria, enqueuing a read command to perform a read operation on the identified storage location for deferred execution.

(A15) In some embodiments of the non-transitory computer readable storage medium of A14, the one or more programs include a read module for receiving read requests from the host device and for initiating executions of read operations on particular storage locations in the non-volatile memory system, a read disturb module for counting or tracking read disturbs on predefined memory portions on non-volatile memory system, and a deferred execution module for initiating execution of read commands that have been enqueued for deferred execution.

(A16) In some embodiments of the non-transitory computer readable storage medium of any of A14 and A15, the one or more programs include instructions that when executed by the non-volatile memory controller cause the non-volatile memory system to perform the method of any of A2-A10, described above.

Numerous details are described herein to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 is a block diagram illustrating an implementation of a non-volatile memory system 100, in accordance with some embodiments. While some example features are illustrated, various other features have not been illustrated for the sake of brevity and so as not to obscure pertinent aspects of the example embodiments disclosed herein. To that end, as a non-limiting example, non-volatile memory system 100 includes a storage device 120 (also sometimes called an information storage device, or a data storage device, or a memory device), which includes a storage controller 124 and a storage medium 130, and is used in conjunction with or includes a computer system 110 (e.g., a host system or a host computer). In some embodiments, storage medium 130 is a single flash memory device while in other embodiments storage medium 130 includes a plurality of flash memory devices. In some embodiments, storage medium 130 is NAND-type flash memory or NOR-type flash memory. In some embodiments, storage medium 130 includes one or more three-dimensional (3D) memory devices. Further, in some embodiments, storage controller 124 is a solid-state drive (SSD) controller. However, other types of storage media may be included in accordance with aspects of a wide variety of embodiments (e.g., PCRAM, ReRAM, STT-RAM, etc.). In some embodiments, a flash memory device includes one or more flash memory die, one or more flash memory packages, one or more flash memory channels or the like. In some embodiments, non-volatile memory system 100 (sometimes called a data storage system) includes one or more storage devices 120.

Computer system 110 is coupled to storage controller 124 through data connections 101. However, in some embodiments computer system 110 includes storage controller 124, or a portion of storage controller 124, as a component and/or as a subsystem. For example, in some embodiments, some or all of the functionality of storage controller 124 is implemented by software executed on computer system 110. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host, host system, client, or client system. In some embodiments, computer system 110 is a server system, such as a server system in a data center. In some embodiments, computer system 110 includes one or more processors, one or more types of memory, a display and/or other user interface components such as a keyboard, a touch-screen display, a mouse, a track-pad, a digital camera, and/or any number of supplemental I/O devices to add functionality to computer system 110. In some embodiments, computer system 110 does not have a display and other user interface components.

Storage medium 130 is coupled to storage controller 124 through connections 103. Connections 103 are sometimes called data connections, but typically convey commands in addition to data, and optionally convey metadata, error correction information and/or other information in addition to data values to be stored in storage medium 130 and data values read from storage medium 130. In some embodiments, however, storage controller 124 and storage medium 130 are included in the same device (i.e., an integrated device) as components thereof. Furthermore, in some embodiments, storage controller 124 and storage medium 130 are embedded in a host device (e.g., computer system 110), such as a mobile device, tablet, other computer or computer controlled device, and the methods described herein are performed, at least in part, by the embedded storage controller. Storage medium 130 may include any number (i.e., one or more) of memory devices (e.g., NVM 134-1, NVM 134-2 through NVM 134-n) including, without limitation, persistent memory or non-volatile semiconductor memory devices, such as flash memory device(s). For example, flash memory device(s) can be configured for enterprise storage suitable for applications such as cloud computing, for database applications, primary and/or secondary storage, or for caching data stored (or to be stored) in secondary storage, such as hard disk drives. Additionally, and/or alternatively, flash memory device(s) can also be configured for relatively smaller-scale applications such as personal flash drives or hard-disk replacements for personal, laptop, and tablet computers.

Memory devices (e.g., NVM 134-1, NVM 134-2, etc.) of storage medium 130 include addressable and individually selectable blocks, such as selectable portion of storage medium 131 (also referred to herein as selected portion 131). In some embodiments, the individually selectable blocks (sometimes called erase blocks) are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector, which is a subunit of a page. That is, a block includes a plurality of pages, each page contains a plurality of sectors, and each sector is the minimum unit of data for writing data to or reading data from the flash memory device.

In some embodiments, storage controller 124 includes a management module 121-1, a host interface 129, an input buffer 123-1, an output buffer 123-2, an error control module 125 and a storage medium I/O interface 128. Storage controller 124 may include various additional features that have not been illustrated for the sake of brevity and so as not to obscure pertinent features of the example embodiments disclosed herein, and a different arrangement of features may be possible. Host interface 129 provides an interface to computer system 110 through data connections 101. Similarly, storage medium I/O 128 provides an interface to storage medium 130 though connections 103. In some embodiments, storage medium I/O 128 includes read and write circuitry, including circuitry capable of providing reading signals to storage medium 130 (e.g., reading threshold voltages for NAND-type flash memory).

In some embodiments, management module 121-1 includes one or more processing units 122-1 (sometimes herein called CPUs, processors, or hardware processors, and sometimes implemented using microprocessors, microcontrollers, or the like) configured to execute instructions in one or more programs (e.g., in management module 121-1). In some embodiments, the one or more CPUs 122-1 are shared by one or more components within, and in some cases, beyond the function of storage controller 124. Management module 121-1 is coupled to host interface 129, error control module 125 and storage medium I/O 128 in order to coordinate the operation of these components. In some embodiments, one or more modules of management module 121-1 are implemented in management module 121-2 of computer system 110. In some embodiments, one or more processors of computer system 110 (not shown) are configured to execute instructions in one or more programs (e.g., in management module 121-2). Management module 121-2 is coupled to storage device 120 in order to manage the operation of storage device 120.

Error control module 125 is coupled to storage medium I/O 128, input buffer 123-1, output buffer 123-2, and management module 121-1. Error control module 125 is provided to limit the number of uncorrectable errors inadvertently introduced into data during writes to memory or reads from memory. In some embodiments, error control module 125 is executed in software by the one or more CPUs 122-1 of management module 121-1, and, in other embodiments, error control module 125 is implemented in whole or in part using special purpose circuitry to perform data encoding and decoding functions. To that end, error control module 125 includes an encoder 126 and a decoder 127. Encoder 126 encodes data by applying an error control code to produce a codeword, which is subsequently stored in storage medium 130.

When the encoded data (e.g., one or more codewords) is read from storage medium 130, decoder 127 applies a decoding process to the encoded data to recover the data, and to correct errors in the recovered data within the error correcting capability of the error control code. Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand, some algorithms may be utilized at least to some extent in the decoding of a number of different types or families of error control codes. As such, for the sake of brevity, an exhaustive description of the various types of encoding and decoding algorithms generally available and known to those skilled in the art is not provided herein.

During a write operation, input buffer 123-1 receives data to be stored in storage medium 130 from computer system 110. The data held in input buffer 123-1 is made available to encoder 126, which encodes the data to produce one or more codewords. The one or more codewords are made available to storage medium I/O 128, which transfers the one or more codewords to storage medium 130 in a manner dependent on the type of storage medium being utilized.

A read operation is initiated when computer system (host) 110 sends one or more host read commands (e.g., via data connections 101) to storage controller 124 requesting data from storage medium 130. Storage controller 124 sends one or more read access commands to storage medium 130, via storage medium I/O 128, to obtain raw read data in accordance with memory locations (addresses) specified by the one or more host read commands. Storage medium I/O 128 provides the raw read data (e.g., comprising one or more codewords) to decoder 127. If the decoding is successful, the decoded data is provided to output buffer 123-2, where the decoded data is made available to computer system 110. In some embodiments, if the decoding is not successful, storage controller 124 may resort to a number of remedial actions or provide an indication of an irresolvable error condition.

Figure 2:
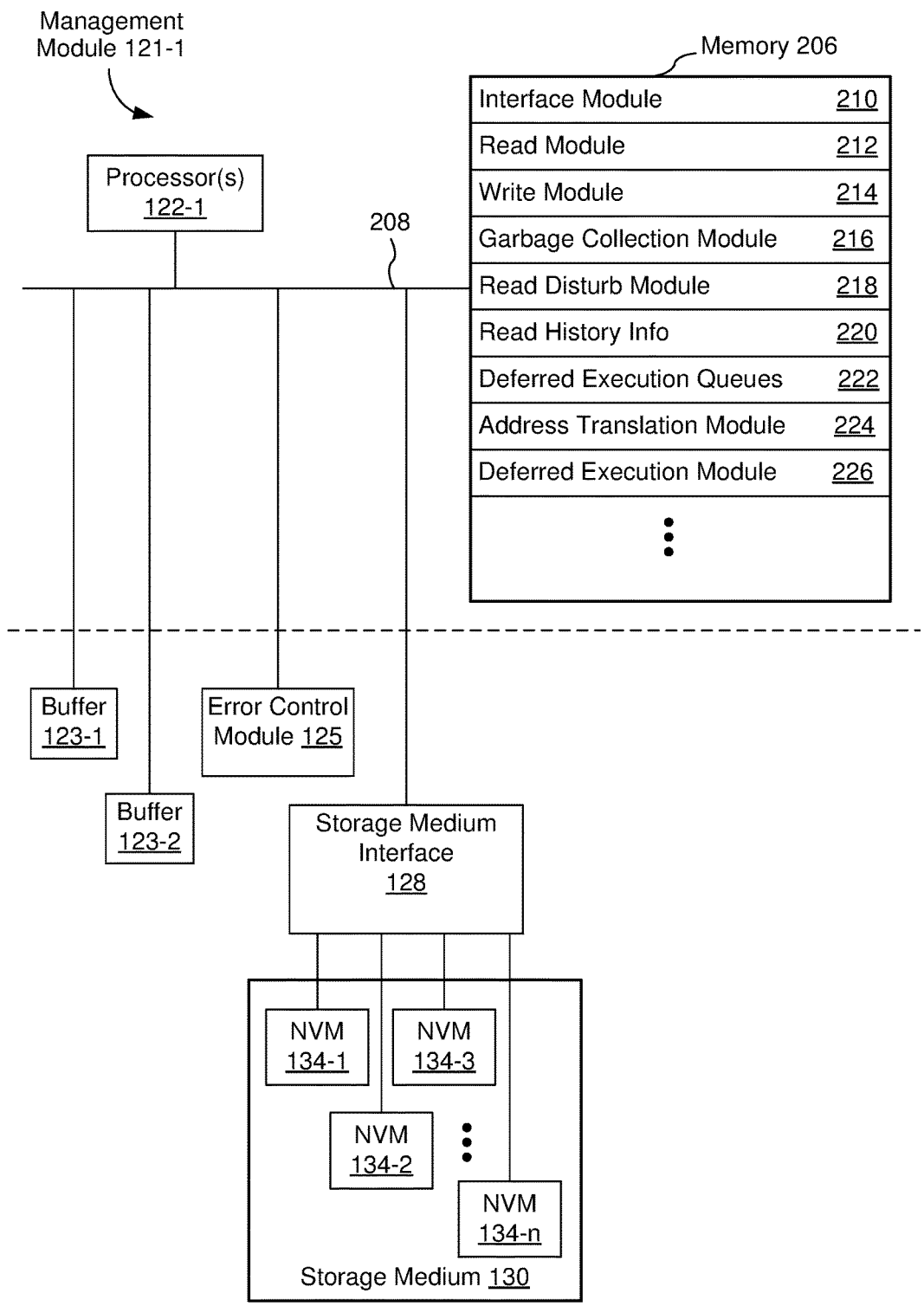
FIG. 2 is a block diagram illustrating a memory management module of a non-volatile memory controller, in accordance with some embodiments.

FIG. 2 is a block diagram illustrating an implementation of a management module 121-1 (hereinafter management module 121 unless specifically designated otherwise), in accordance with some embodiments. Management module 121 typically includes one or more processing units 122-1 (sometimes herein called CPUs, processors, or hardware processors, and sometimes implemented using microprocessors, microcontrollers, or the like) for executing modules, programs and/or instructions stored in memory 206 and thereby performing processing operations; memory 206 (sometimes herein called controller memory); and one or more communication buses 208 for interconnecting these components. Communication buses 208 optionally include circuitry (sometimes called a chipset) that interconnects and controls communications between system components. In some embodiments, management module 121 is coupled to buffers 123-1 and 123-2, error control module 125, and storage medium I/O 128 by communication buses 208. Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206 optionally includes one or more storage devices remotely located from processor(s) 122-1. Memory 206, or alternately the non-volatile memory device(s) within memory 206, comprises a non-transitory computer readable storage medium. In some embodiments, memory 206, or the computer readable storage medium of memory 206 stores the following programs, modules, and data structures, or a subset or superset thereof:

- an interface module 210 used for communicating with other components, such as non-volatile memory devices 134, and computer system 110;
- a read module 212 used for reading from non-volatile memory devices 134;
- a write module 214 used for writing to non-volatile memory devices 134;
- a garbage collection module 216 used for controlling garbage collection in a storage medium (e.g., storage medium 130, FIG. 1);
- a read disturb module 218 used for counting or tracking read disturbs;
- one or more read history information data structures 220, for example one or more tables, that store read history information for respective memory portions, such as superblocks;
- deferred execution queues 222 that stores information associated with enqueued commands;
- an address translation module 224 that is used for mapping logical addresses to physical addresses; and
- a deferred execution module 226 for initiating execution of read commands that have been enqueued for deferred execution.

Each of the above identified elements may be stored in one or more of the previously mentioned memory devices that together form memory 206, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, provide instructions for implementing respective operations in the methods described below with reference to FIGS. 3A, 3B, and 4.

Although FIG. 2 shows management module 121-1, FIG. 2 is intended more as a functional description of the various features which may be present in a management module, or non-volatile memory controller, than as a structural schematic of the embodiments described herein. In practice, and as recognized by those of ordinary skill in the art, items shown separately could be combined and some items could be separated. Further, as noted above, in some embodiments, one or more modules of management module 121-1 are implemented in management module 121-2 of computer system 110.

Flash memory devices utilize memory cells to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage, is used to represent one or more data values. In some embodiments, during a read operation, a reading threshold voltage is applied to the control gate of the transistor and the resulting sensed current or voltage is mapped to a data value.

The terms "cell voltage" and "memory cell voltage," in the context of flash memory cells, typically mean the threshold voltage of the memory cell, which is the minimum voltage that needs to be applied to the gate of the memory cell's transistor in order for the transistor to conduct current. Similarly, reading threshold voltages (sometimes also called reading signals, reading voltages, and/or read thresholds) applied to flash memory cells are gate voltages applied to the gates of the flash memory cells to determine whether the memory cells conduct current at that gate voltage. In some embodiments, when a flash memory cell's transistor conducts current at a given reading threshold voltage, indicating that the cell voltage is less than the reading threshold voltage, the raw data value for that read operation is a "1," and otherwise the raw data value is a "0."

Figure 3A:
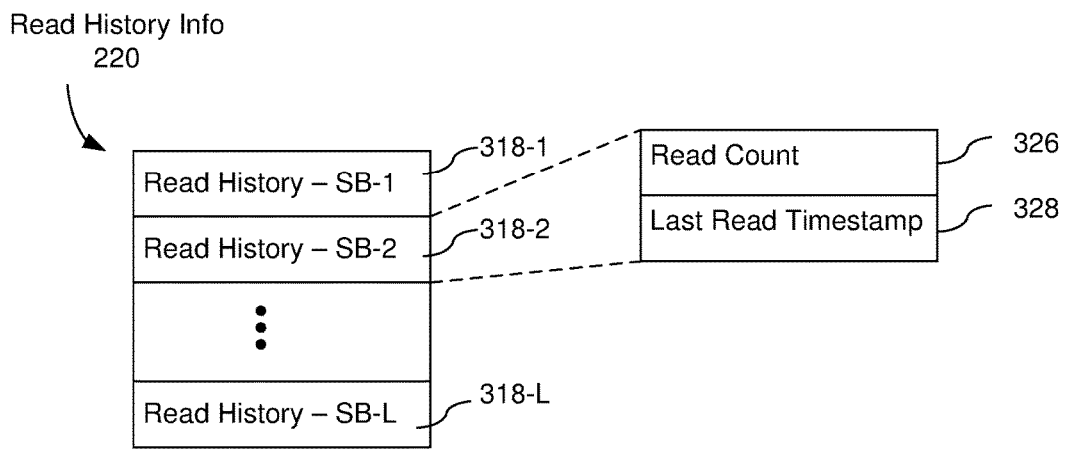
FIG. 3A is a block diagram illustrating a data structure or set of data structures storing read history information for respective memory portions, such as superblocks, in accordance with some embodiments.

FIG. 3A shows a block diagram of a read history data structure 220 storing read history information for respective memory portions, such as superblocks, in accordance with some embodiments. In some embodiments, read history data structure 220 includes a read history record 318 (e.g., one of records 318-1 to 318-L) for each respective memory portion of a plurality of such memory portions (e.g., erase blocks, respective zones or other portions of erase blocks, superblocks, or respective portions of superblocks). In the example shown in FIG. 3A, the memory portions are superblocks, each of which includes a plurality of erase blocks (e.g., 4 to 128 erase blocks), and each record 318 stores read history information for a respective superblock of a plurality of superblocks (e.g., superblocks SB-1 to SB-L).

In some embodiments, each read history record 318 includes a read count 326 for the corresponding memory portion (e.g., superblock). Typically, the read count is a count of read operations performed on the memory portion since the last time the memory portion was erased.

In some embodiments, each read history record 318 also includes a last read timestamp 328 for the corresponding memory portion (e.g., superblock). Typically, the last read timestamp indicates the last time a read operation was performed on the memory portion. In some other embodiments, last read timestamps for respective memory portions are stored in one or more data structures distinct from the read history data structure 220.

In some embodiments, each of the read history records 318 is stored (e.g., by management module 121-1, in controller memory 206 and/or storage medium 130) as a separate or distinct data structure.

Figure 3B:
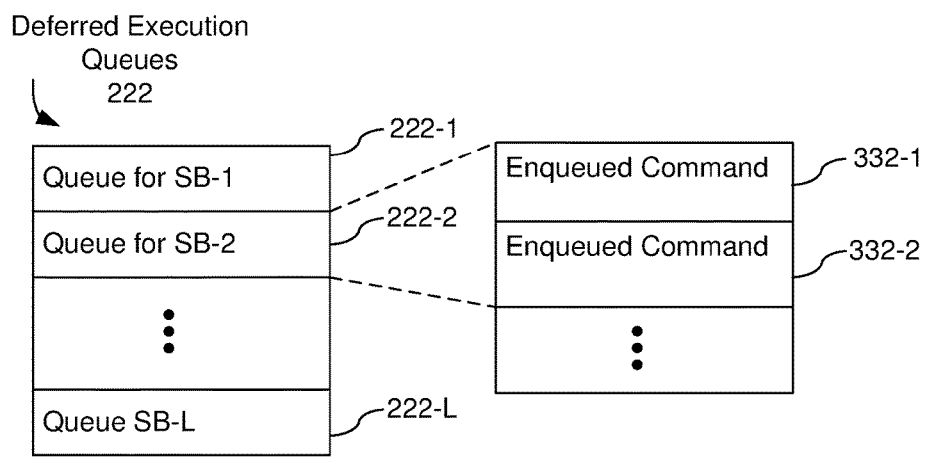
FIG. 3B is a block diagram illustrating a set of deferred execution queues, in accordance with some embodiments.

FIG. 3B shows a block diagram of deferred execution queues 222 storing enqueued command information for respective memory portions in accordance with some embodiments. In some embodiments, deferred execution queues 222 include a deferred execution queue 222-1, 222-2, etc. for each respective memory portion of a plurality of such memory portions. In the example shown in FIG. 3B, the memory portions are superblocks, each of which include a plurality of erase blocks (e.g., 4 to 128 erase blocks), and each deferred execution queue 222 stores enqueued commands 332 (e.g., commands 332-1, 332-2, etc.) for a respective superblock of a plurality of superblocks. Other examples of respective memory portions are provided above. The enqueued commands 332 include read commands whose execution has been deferred.

In some embodiments, or in some circumstances, most of the deferred execution queues 222 are empty, because their corresponding memory portions do not satisfy predefined read throttling criteria; the deferred execution queues 222 that are not empty are those for memory portions that do satisfy the predefined read throttling criteria and that have at least one read command whose execution has been deferred. Stated another way, the deferred execution queue 222 for a respective memory portion that satisfies the predefined read throttling criteria and that has at least one read command whose execution has been deferred includes one or more enqueued commands.

In some embodiments, a single data structure stores enqueued commands for all or a plurality of the memory portions. For example, in some such embodiments, the data structure includes multiple linked lists, including a separate linked list of enqueued commands for each memory portion having at least one enqueued command. In another example, the data structure includes one or more fields (e.g., a field storing a memory portion identifier) for identifying the enqueued commands for each distinct memory portion having at least one enqueued command.

Figure 4:
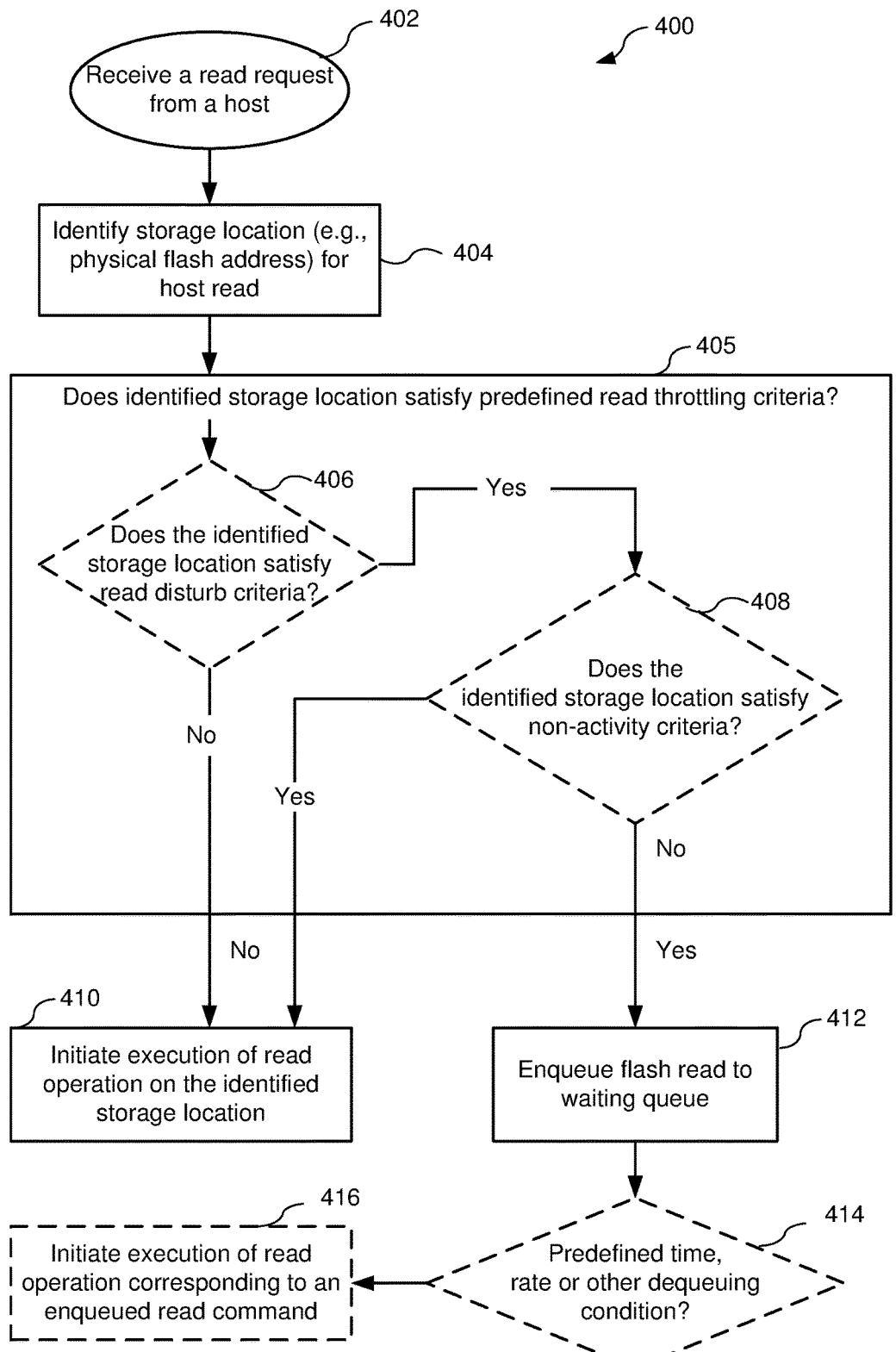
FIG. 4 illustrates a flowchart representation of a method of processing read requests in a non-volatile memory system, in accordance with some embodiments.

FIG. 4 illustrates a flowchart representation of a method 400 of selectively throttling host reads in a non-volatile memory system 100, in accordance with some embodiments. With reference to the non-volatile memory system 100 pictured in FIG. 1, in some embodiments, the method 400 is performed by a storage device (e.g., storage device 120, FIG. 1) or one or more components of the storage device (e.g., storage controller 124 of storage device 120, FIG. 1). In some embodiments, the method 400 is governed by instructions that are stored in a non-transitory computer readable storage medium and that are executed by one or more processors of a device, such as the one or more processing units (CPUs) 122-1 of management module 121-1 (FIG. 1).

In some embodiments, some of the operations (or alternatively, steps) of method 400 are performed at a host system (e.g., computer system 110) that is operatively coupled with the storage device, and other operations of method 400 are performed at the storage device. In some of these embodiments, method 400 is governed, at least in part, by instructions that are stored in a non-transitory computer readable storage medium and that are executed by one or more processors (e.g., hardware processors) of the host system (the one or more processors of the host system are not shown in FIG. 1).

With reference to FIG. 2, in some embodiments, the operations of method 400 are performed, at least in part, by a read module (e.g., read module 212, FIG. 2), a read disturb module (e.g., read disturb module 218, FIG. 2), a garbage collection module (e.g., garbage collection module 216, FIG. 2), and a deferred execution module (e.g., deferred execution module 226, FIG. 2). For ease of explanation, unless otherwise stated, the following describes method 400 as performed by a storage device (e.g., by storage device 120, FIG. 1, or a component thereof).

Method 400 begins, in some embodiments, in accordance with receiving (402), from a host device external to the non-volatile memory system (e.g., storage device 120, FIG. 1), a read request to read data from the non-volatile memory system. In response to receiving the read request, a storage location in the non-volatile memory system corresponding to the data requested by the read request received from the host device is identified (404).

In some embodiments, the received host read request includes or specifies a physical address, in a physical address space of the non-volatile memory system that identifies the data requested. In some other embodiments, the received host read request includes or specifies a logical address, in a logical address space of the host device that identifies the data requested. In some embodiments, identifying a storage location in the non-volatile memory system corresponding to data requested by the read request received from the host device includes translating a logical address specified by the read request into a physical address in non-volatile memory in the non-volatile memory system.

In some embodiments, the read request specifies a range of logical addresses or set of logical addresses, in which case the identified storage location (see 404) corresponds to a logical address in the specified range or set of logical addresses. Similarly, in some embodiments, the read request specifies a range of physical addresses or set of physical addresses, in which case the identified storage location (see 404) corresponds to a physical address in the specified range or set of physical addresses.

The storage device determines whether the identified storage location corresponding to the data requested by the read request received from the host device satisfies read throttling criteria (405). In some embodiments, determining if the identified storage location satisfies predefined read throttling criteria (405) includes determining if the identified storage location satisfies predefined read disturb criteria (406).

In some embodiments, determining if the identified storage location satisfies predefined read disturb criteria includes determining if the identified storage location falls within a range of non-volatile memory locations that satisfy the predefined read disturb criteria. It is noted that the "range of non-volatile memory locations" that the identified storage location falls within is, in some embodiments (and typically), a predefined range of non-volatile memory locations. For example, in some embodiments, the aforementioned "range of non-volatile memory locations" is the range of physical memory locations for a superblock of non-volatile memory (e.g., flash memory) that includes the identified storage location. In some other embodiments, the aforementioned "range of non-volatile memory locations" is the range of physical memory locations for an erase block of non-volatile memory that includes the identified storage location. In such embodiments, the aforementioned "range of non-volatile memory locations" is predefined in the sense that it is independent of the received read request, or any other received read request or write request, and was defined or determined prior to the receipt of the read request received in operation 402.

Furthermore, in some embodiments, determining if the identified storage location satisfies predefined read throttling criteria includes determining if the identified storage location satisfies predefined read disturb criteria (406), and further determining if said range of non-volatile memory locations satisfy predefined non-activity criteria (408). For example, in some embodiments, the predefined non-activity criteria includes a criterion that no read operations have been initiated on said range of non-volatile memory locations in the last X milliseconds, where X is an appropriate value such as a value between 5 and 20. In some embodiments, X is a tunable or configurable parameter, determined based on the host read bandwidth and the number of superblocks in the storage device.

In some other embodiments, the range of non-volatile memory locations satisfy the predefined read disturb criteria if a read disturb count for the range of non-volatile memory locations satisfies a read disturb count threshold. For example, if the applicable range is the range of physical addresses for a superblock, the predefined read disturb criteria would be a read disturb count threshold (e.g., 50,000 reads) for the superblock, and the range of non-volatile memory locations would satisfy the predefined read disturb criteria if the read disturb count for the superblock is greater than (or, alternatively, equal to or greater than) the read disturb count threshold.

Furthermore, in some embodiments, determining if the identified storage location satisfies predefined read throttling criteria includes determining if the identified storage location satisfies predefined read disturb criteria and further determining whether execution of at least one read operation on a location within said range of non-volatile memory locations has been initiated during a predefined time period. For example, if any read operation for the range of non-volatile memory locations (e.g., a particular physical address range) has been initiated in the last X milliseconds (see examples, above), the read operation on the identified storage location is enqueued.

The storage device, in response to determining that the identified storage location does not satisfy the read disturb criteria (406—No), initiates (410) execution of read operation on the identified storage location. In addition, the storage device, in response to determining that the identified storage location does satisfy the read disturb criteria (406—Yes), but that the location satisfies the non-activity criteria (408—Yes), initiates (410) execution of read operation on the identified storage location.

The storage device, in accordance with a determination that the identified storage location that satisfies the read disturb criteria (406—Yes), but does not satisfies non-activity criteria (408—No), enqueues (412) a read command to perform a read operation on the identified storage location for deferred execution. In some embodiments, enqueuing the read command to perform a read operation on the identified storage location for deferred execution includes placing the read command on a command execution queue, such as one of the deferred execution queues shown in FIG. 3B, that corresponds to the aforementioned range of non-volatile memory locations (i.e., the range of non-volatile memory locations that satisfy the predefined read disturb criteria).

In some embodiments, a separate command queue or deferred execution queue is used for each superblock, or each superblock whose read disturb count satisfies a predefined threshold. As noted above, in some other embodiments, the aforementioned range of non-volatile memory locations (i.e., the range of non-volatile memory locations that satisfy the predefined read disturb criteria) comprises all memory locations in a superblock that includes the identified storage location. More generally, in some embodiments, the aforementioned range of non-volatile memory locations (i.e., the range of non-volatile memory locations that satisfy the predefined read disturb criteria) comprises all memory locations in a predefined memory portion (e.g., one or more erase blocks, one or more respective zones or other portions of one or more erase blocks, one or more superblocks, or one or more respective portions of one or more superblocks).

The storage device initiates execution of a read operation corresponding to an enqueued command (see 416). In some embodiments, the storage device (e.g., storage device 120, FIG. 1, or a component thereof such as deferred execution module 226, FIG. 1) initiates (414, 416) execution of read operations corresponding to read commands enqueued on one or more command execution queues at predefined times. Typically, the predefined times at which the storage device initiates (414, 416) execution of read operations corresponding to read commands enqueued on one or more command execution queues are independent of the times at which read commands are enqueued (412) on respective command execution queues.

In some embodiments, for each predefined range of memory locations for which at least one read command has been enqueued, the storage device initiates (414, 416) execution of read operations corresponding to respective enqueued read commands at a predefined rate (e.g., the storage device initiates execution of read operations at a rate of R operations per second, where R is an appropriate rate, such as 100 to 2000 (e.g., with R=1000, 1000 reads per second can be handled with an average of 1 millisecond response times)), or at predefined scheduled times (e.g., each time a clock in the storage controller of the storage device reaches a predefined scheduled time, or each time a clock interrupt occurs), until there are no read commands enqueued for the predefined range of memory locations. More generally, in some embodiments the storage device initiates (414, 416) execution of read operations corresponding to respective enqueued read commands if a predefined dequeuing condition is satisfied.

In some embodiments, the rate at which read operations are dequeued from the command execution queue for a particular range of memory locations has a predefined relationship (e.g., a predefined ratio) to the predefined time period of the non-activity criteria used in operation 408. For example, if, while the command execution queue is not empty, read operations are dequeued and executed once every 1.0 milliseconds (for example), then the non-activity criteria in operation 408 would typically be implemented as a criterion that no read operations have been initiated on the predefined range of non-volatile memory locations in the last 5 to 20 milliseconds.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the "second contact" are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

What is claimed is:

1. A method of processing read requests in a non-volatile memory system, the method comprising:
   receiving, from a host device external to the non-volatile memory system, a read request to read data from the non-volatile memory system; and
   in response to receiving the read request:
      identifying a storage location in the non-volatile memory system corresponding to data requested by the read request received from the host device;
      determining if the identified storage location satisfies predefined read disturb criteria;
      in accordance with a determination that the identified storage location does not satisfy the predefined read disturb criteria, initiating execution of a read operation corresponding to the read request on the identified storage location; and
      in accordance with a determination that the identified storage location satisfies the predefined read disturb criteria;
         determining if the identified storage location satisfies predefined non-activity criteria for a predefined time period; and
         in accordance with a determination that the identified storage location satisfies predefined non-activity criteria for the predefined time period:
            enqueuing a read command corresponding to the read request to perform the read operation on the identified storage location for deferred execution; and
            initiating execution of read operations corresponding to the enqueued read command and other enqueued read commands at a predefined rate, wherein the predefined rate has a predefined ratio with the predefined time period.

2. The method of claim 1, wherein determining if the identified storage location satisfies predefined read disturb criteria includes determining if the identified storage location falls within a range of non-volatile memory locations that satisfy the predefined read disturb criteria.

3. The method of claim 2, wherein the range of non-volatile memory locations satisfy the predefined read disturb criteria if a read disturb count for the range of non-volatile memory locations satisfies a read disturb count threshold.

4. The method of claim 2, wherein enqueuing the read command comprises placing the read command on a command execution queue that corresponds to the range of non-volatile memory locations.

5. The method of claim 1, wherein:
identifying a storage location in the non-volatile memory system corresponding to data requested by the read request received from the host device comprises translating a logical address specified by the read request into a physical address in non-volatile memory in the non-volatile memory system;
the logical address is in a logical address space of the host device; and
the physical address is a physical address in a physical address space of the non-volatile memory system.

6. The method of claim 1, wherein the non-volatile memory system comprises a three-dimensional memory.

7. A non-volatile memory controller for controlling access to non-volatile memory in a non-volatile memory system, the non-volatile memory controller comprising:
a host interface for receiving, from a host device external to the non-volatile memory system, a read request to read data from the non-volatile memory system;
one or more processors; and
memory storing one or more programs for execution by the one or more processors, the one or more programs including instructions for:
identifying a storage location in the non-volatile memory system corresponding to data requested by the read request received from the host device;
determining if the identified storage location satisfies predefined read disturb criteria;
in accordance with a determination that the identified storage location does not satisfy the predefined read disturb criteria, initiating execution of a read operation corresponding to the read request on the identified storage location; and
in accordance with a determination that the identified storage location satisfies the predefined read disturb criteria;
determining if the identified storage location satisfies predefined non-activity criteria for a predefined time period; and
in accordance with a determination that the identified storage location satisfies predefined non-activity criteria for the predefined time period:
enqueuing a read command corresponding to the read request to perform the read operation on the identified storage location for deferred execution; and
initiating execution of read operations corresponding to the enqueued read command and other enqueued read commands at a predefined rate, wherein the predefined rate has a predefined ratio with the predefined time period.

8. The non-volatile memory controller of claim 7, wherein the one or more programs include:
a read module for receiving read requests from the host device and for initiating execution of read operations on particular storage locations in the non-volatile memory system;
a read disturb module for counting or tracking read disturbs on predefined memory portions of the non-volatile memory system; and a deferred execution module for initiating execution of read commands that have been enqueued for deferred execution.

9. The non-volatile memory controller of claim 7, wherein determining if the identified storage location satisfies predefined read disturb criteria includes determining if the identified storage location falls within a range of non-volatile memory locations that satisfy the predefined read disturb criteria.

10. The non-volatile memory controller of claim 9, wherein the range of non-volatile memory locations satisfy the predefined read disturb criteria if a read disturb count for the range of non-volatile memory locations satisfies a read disturb count threshold.

11. The non-volatile memory controller of claim 9, wherein enqueuing the read command comprises placing the read command on a command execution queue that corresponds to the range of non-volatile memory locations.

12. The non-volatile memory controller of claim 7, wherein the memory comprises a three-dimensional memory.

13. A non-volatile memory system comprising:
means for receiving, from a host device external to the non-volatile memory system, a read request to read data from a non-volatile memory in the non-volatile memory system;
means for identifying a storage location in the non-volatile memory corresponding to data requested by the read request received from the host device;
means for determining if the identified storage location satisfies predefined read disturb criteria and, in accordance with a determination that the identified storage location does not satisfy the predefined read disturb criteria, for initiating execution of a read operation corresponding to the read request on the identified storage location; and
means for, in accordance with a determination that the identified storage location satisfies the predefined read disturb criteria:
determining if the identified storage location satisfies predefined non-activity criteria for a predefined time period; and
in accordance with a determination that the identified storage location satisfies predefined non-activity criteria for the predefined time period:
enqueuing a read command corresponding to the read request to perform the read operation on the identified storage location for deferred execution; and
initiating execution of read operations corresponding to the enqueued read command and other enqueued read commands at a predefined rate, wherein the predefined rate has a predefined ratio with the predefined time period.

14. The non-volatile memory system of claim 13, further comprising:
read disturb tracking means for counting or tracking read disturbs on predefined memory portions of non-volatile memory system; and
deferred execution means for initiating execution of read commands that have been enqueued for deferred execution.

15. The non-volatile memory system of claim 13, wherein the means for determining if the identified storage location satisfies predefined read disturb criteria includes means for determining if the identified storage location falls within a range of non-volatile memory locations that satisfy the predefined read disturb criteria.

16. The non-volatile memory system of claim 15, wherein the range of non-volatile memory locations satisfies the predefined read disturb criteria if a read disturb count for the range of non-volatile memory locations satisfies a read disturb count threshold.

17. The non-volatile memory system of claim 15, wherein enqueuing the read command comprises placing the read command on a command execution queue that corresponds to the range of non-volatile memory locations.

18. The non-volatile memory system of claim 13, wherein:
- means for identifying a storage location in the non-volatile memory system corresponding to data requested by the read request received from the host device comprises means for translating a logical address specified by the read request into a physical address in non-volatile memory in the non-volatile memory system;
- the logical address is in a logical address space of the host device; and
- the physical address is a physical address in a physical address space of the non-volatile memory system.

19. The non-volatile memory system of claim 13, wherein the non-volatile memory comprises a three-dimensional memory.

\* \* \* \* \*